(12) United States Patent
Liao et al.

(10) Patent No.: US 8,144,479 B2
(45) Date of Patent: Mar. 27, 2012

(54) WIRELESS COMMUNICATION MODULE

(75) Inventors: Kuo-Hsien Liao, Taichung (TW); Kuan-Hsing Li, Taichung (TW)

(73) Assignee: Universal Scientific Industrial Co., Ltd. (TW)

( * ) Notice: Subject to any disclaimer, the term of this patent is extended or adjusted under 35 U.S.C. 154(b) by 1127 days.

(21) Appl. No.: 12/004,619

(22) Filed: Dec. 24, 2007

(65) Prior Publication Data

US 2009/0161334 A1 Jun. 25, 2009

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/763; 361/780; 361/784

(58) Field of Classification Search .......... 361/782–785, 361/790, 770, 760–766
See application file for complete search history.

(56) References Cited

U.S. PATENT DOCUMENTS

| | | | | |
|---|---|---|---|---|
| 6,154,370 A | * | 11/2000 | Degani et al. | 361/761 |
| 6,297,551 B1 | * | 10/2001 | Dudderar et al. | 257/723 |
| 6,489,669 B2 | * | 12/2002 | Shimada et al. | 257/686 |

* cited by examiner

*Primary Examiner* — Tuan T Dinh
(74) *Attorney, Agent, or Firm* — Bliss McGlynn, P.C.

(57) ABSTRACT

A wireless communication module includes: amounting board including a dielectric frame and a dielectric panel that are stacked together, the frame defining a frame space; at least one electronic component mounted on the mounting board and extending into the frame space; and a plurality of conductive bodies embedded in the dielectric frame and surrounding the frame space so as to prevent electromagnetic interference resulting from the electronic component.

7 Claims, 8 Drawing Sheets

WIRELESS COMMUNICATION MODULE

BACKGROUND OF THE INVENTION

1. Field of the Invention

The invention relates to a wireless communication module, more particularly to a wireless communication module including a plurality of conductive bodies surrounding an electronic component to prevent electromagnetic interference from occurring.

2. Description of the Related Art

Referring to FIG. 1, a conventional wireless communication module 1 is shown to be adapted to be mounted on a circuit board 2, and includes a frame 12 adapted to be mounted on the board 2, a panel 11 stacked on the frame 12, a plurality of electronic components 13, 14 mounted on the panel 11, a metal cover 15 covering the panel 11 and the electronic component 13, and a pair of conductive wires 16 connected electrically to the panel 11 and the board 2. The frame 12 defines a frame space 121 for extension of the electronic component 14 therein.

The metal cover 15 serves to eliminate electromagnetic interference resulting from the electronic component 13. However, the profile and weight of the wireless communication module 1 are significantly increased due to the inclusion of the metal cover 15, resulting in an adverse effect on miniaturization of the wireless communication module 1.

SUMMARY OF THE INVENTION

Therefore, the object of the present invention is to provide a wireless communication module that can eliminate the aforesaid drawback associated with the prior art.

Accordingly, a wireless communication module of this invention comprises: a mounting board including a dielectric frame and a dielectric panel that are stacked together, the frame defining a frame space; at least one electronic component mounted on the mounting board and extending into the frame space; and a plurality of conductive bodies embedded in the dielectric frame and surrounding the frame space so as to prevent electromagnetic interference resulting from the electronic component.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
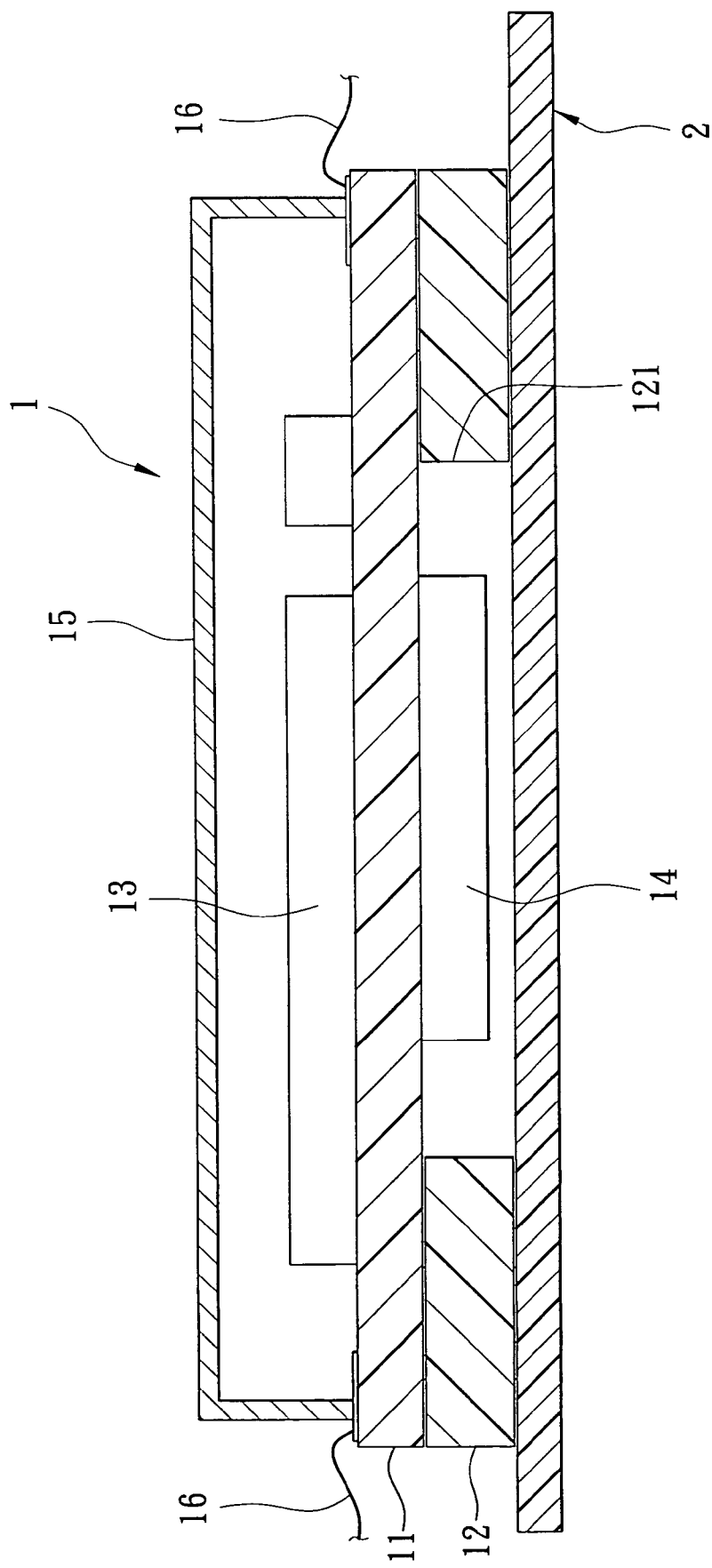
FIG. 1 is a sectional view of a conventional wireless communication module.

Before the present invention is described in greater detail with reference to the accompanying preferred embodiments, it should be noted herein that like elements are denoted by the same reference numerals throughout the disclosure.

Figure 2:
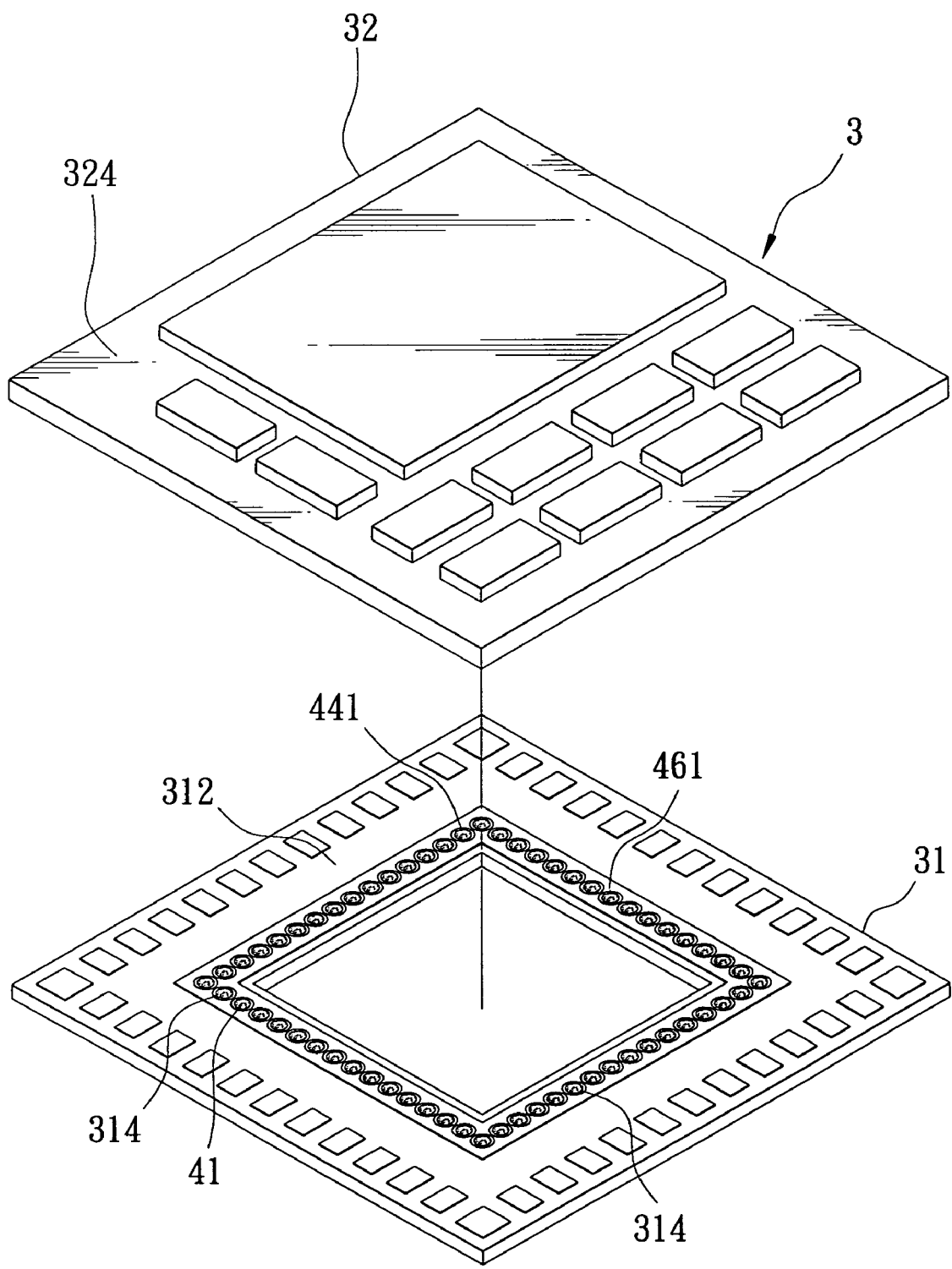
FIG. 2 is an exploded top perspective view of the first preferred embodiment of a wireless communication module according to the present invention.
Figure 3:
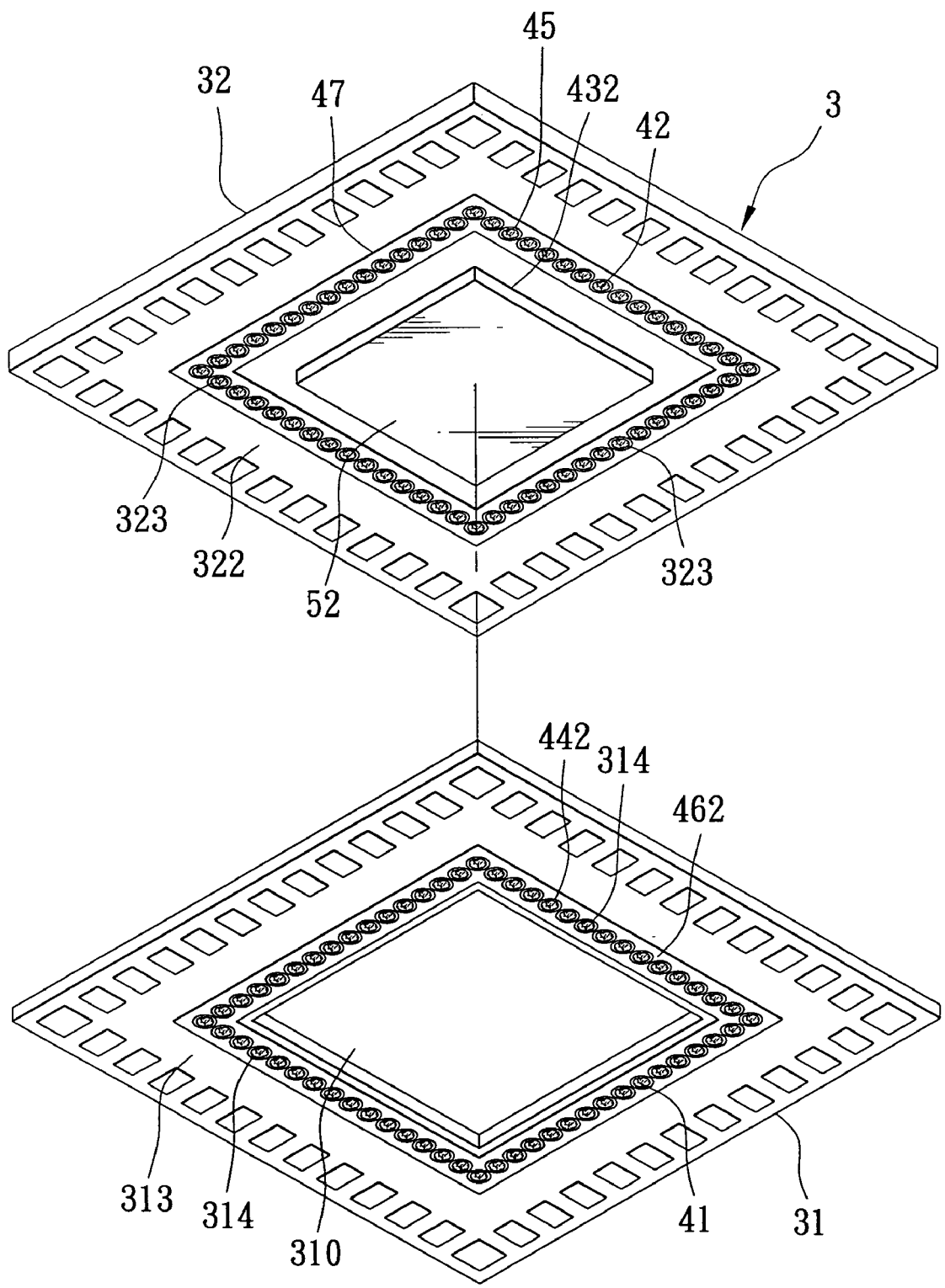
FIG. 3 is an exploded bottom perspective view of the first preferred embodiment.
Figure 4:
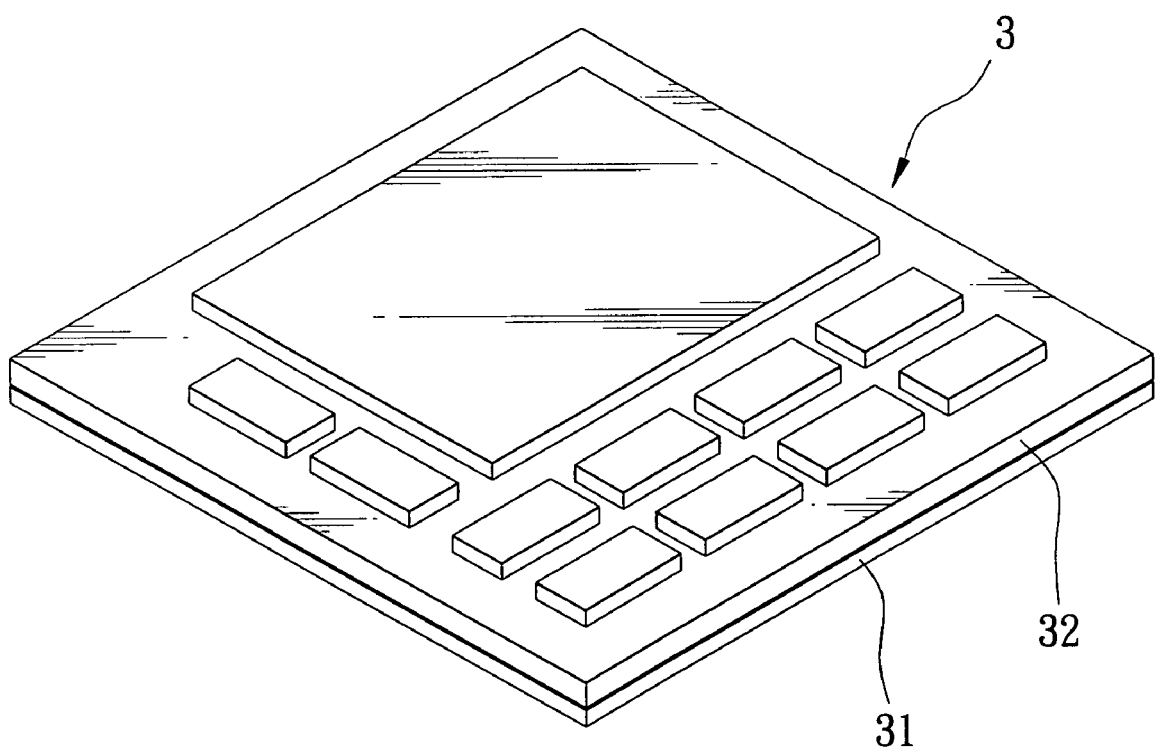
FIG. 4 is an assembled top perspective view of the first preferred embodiment.
Figure 5:
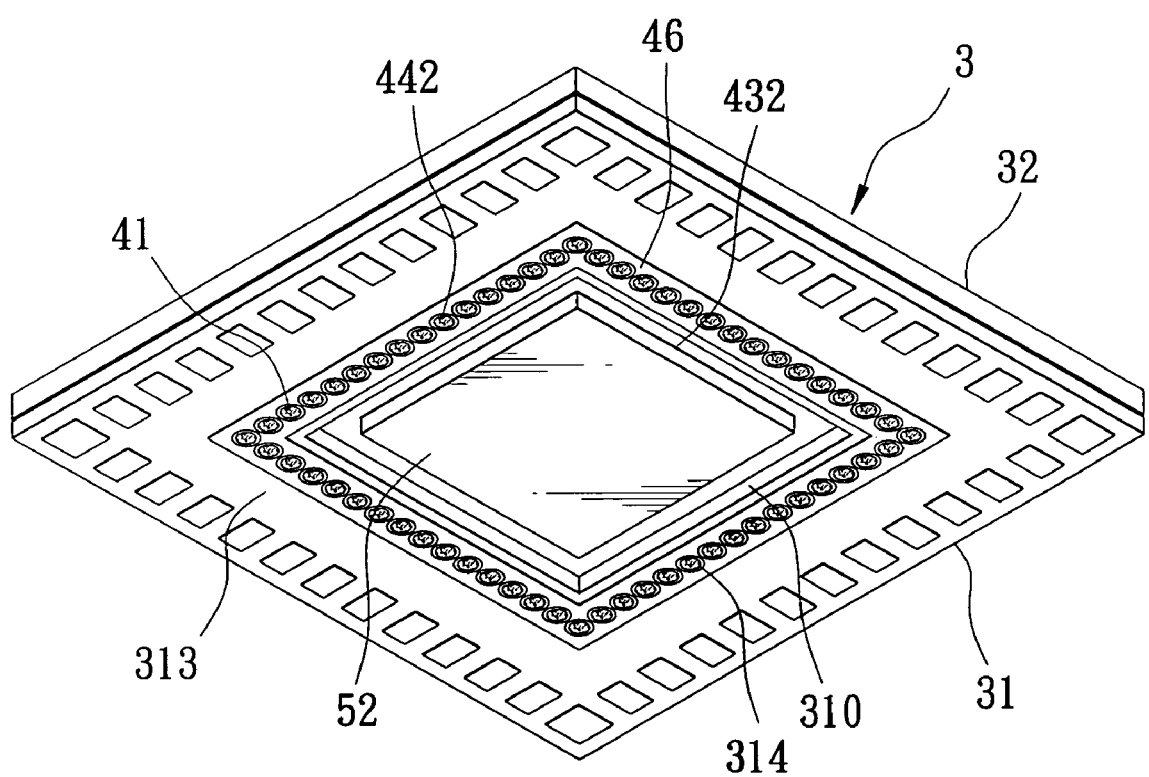
FIG. 5 is an assembled bottom perspective view of the first preferred embodiment.
Figure 6:
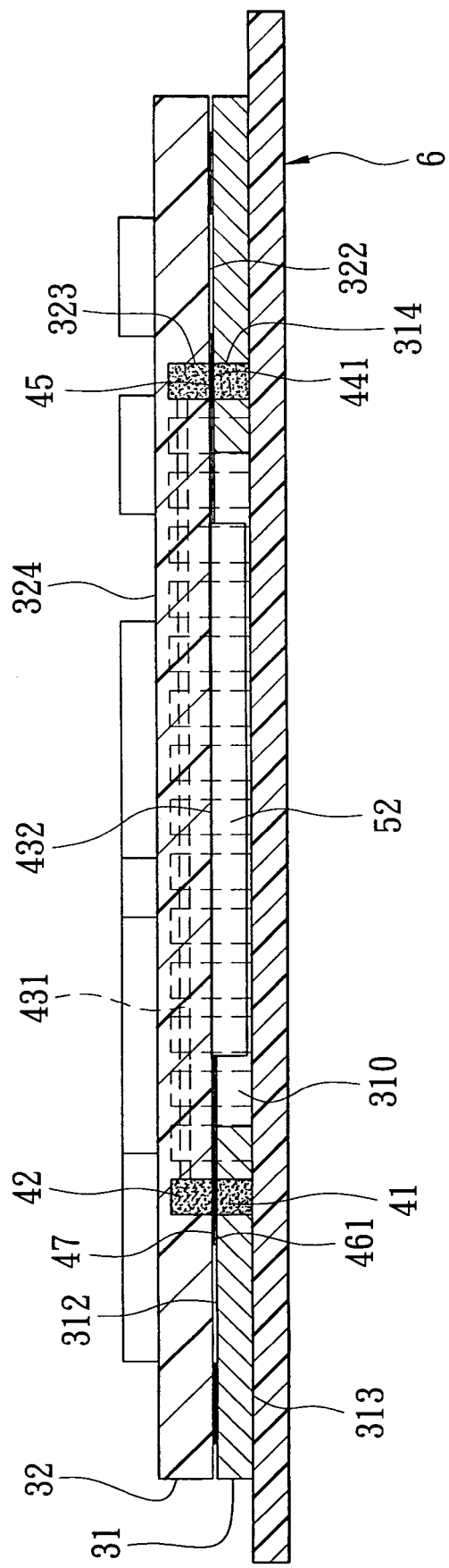
FIG. 6 is a sectional view of the first preferred embodiment.

Referring to FIGS. 2 and 3, the first preferred embodiment of a wireless communication module according to the present invention is shown to be adapted to be mounted on a circuit board 6 (see FIG. 6) and to include: a mounting board 3 including a dielectric frame 31 and a dielectric panel 32 that are stacked together (see FIGS. 4 and 5), the dielectric frame 31 defining a frame space 310; at least one electronic component 52 mounted on the mounting board 3 and extending into the frame space 310 (see FIG. 5); and a plurality of first conductive bodies 41 embedded in the dielectric frame 31 and surrounding the frame space 310 so as to prevent electromagnetic interference resulting from the electronic component 52. The electronic component 52 is one that can lead to electromagnetic interference to other components.

The dielectric frame 31 has opposite inner and outer surfaces 312, 313, and is formed with a plurality of retaining holes 314 surrounding the frame space 310. Each of the retaining holes 314 extends through the inner and outer surfaces 312, 313, and each of the first conductive bodies 41 fills a respective one of the retaining holes 314. In this embodiment, the first conductive bodies 41 are made from a metal material suitable for grounding.

Each of the retaining holes 314 has an inner end terminated at the inner surface 312 of the dielectric frame 31, and an outer end terminated at the outer surface 313 of the dielectric frame 31. The wireless communication module further includes a plurality of first conductive pads 441 and a plurality of second conductive pads 442. Each of the first conductive pads 441 is formed on a periphery of the inner end of a respective one of the retaining holes 314, and each of the second conductive pads 442 is formed on a periphery of the outer end of a respective one of the retaining holes 314.

The dielectric panel 32 has opposite inner and outer surfaces 322, 324, and is formed with a plurality of blind holes 323, each of which extends between the inner and outer surfaces 322, 324 and is terminated at the inner surface 322. The wireless communication module further includes a plurality of second conductive bodies 42 embedded in the blind holes 323 of the dielectric panel 32 and corresponding and coupled electrically to the first conductive bodies 41.

Each of the blind holes 323 has an inner end terminated at the inner surface 322 of the dielectric panel 32. The wireless communication module further includes a plurality of third conductive pads 45, each of which is formed on a periphery of the inner end of a respective one of the blind holes 323.

Referring again to FIG. 6, the frame space 310 has opposite inner and outer ends terminated respectively at the inner and outer surfaces 312, 313 of the dielectric frame 31. The wireless communication module further includes first and second conductive layers 461, 462 formed respectively on peripheries of the inner and outer ends of the frame space 310 and connected respectively to the first and second conductive pads 441, 442, and a third conductive layer 47 formed on the inner surface 322 of the dielectric panel 32 and connected to the first conductive layer 461 and the third conductive pads 45.

The wireless communication module further includes a conductive connecting via 431 embedded in the dielectric panel 32 and connected to the second conductive bodies 42, and a conductive connecting layer 432 formed on the inner surface 322 of the dielectric panel 32 and connected to the electronic component 52 and the conductive connecting via 431.

Figure 7:
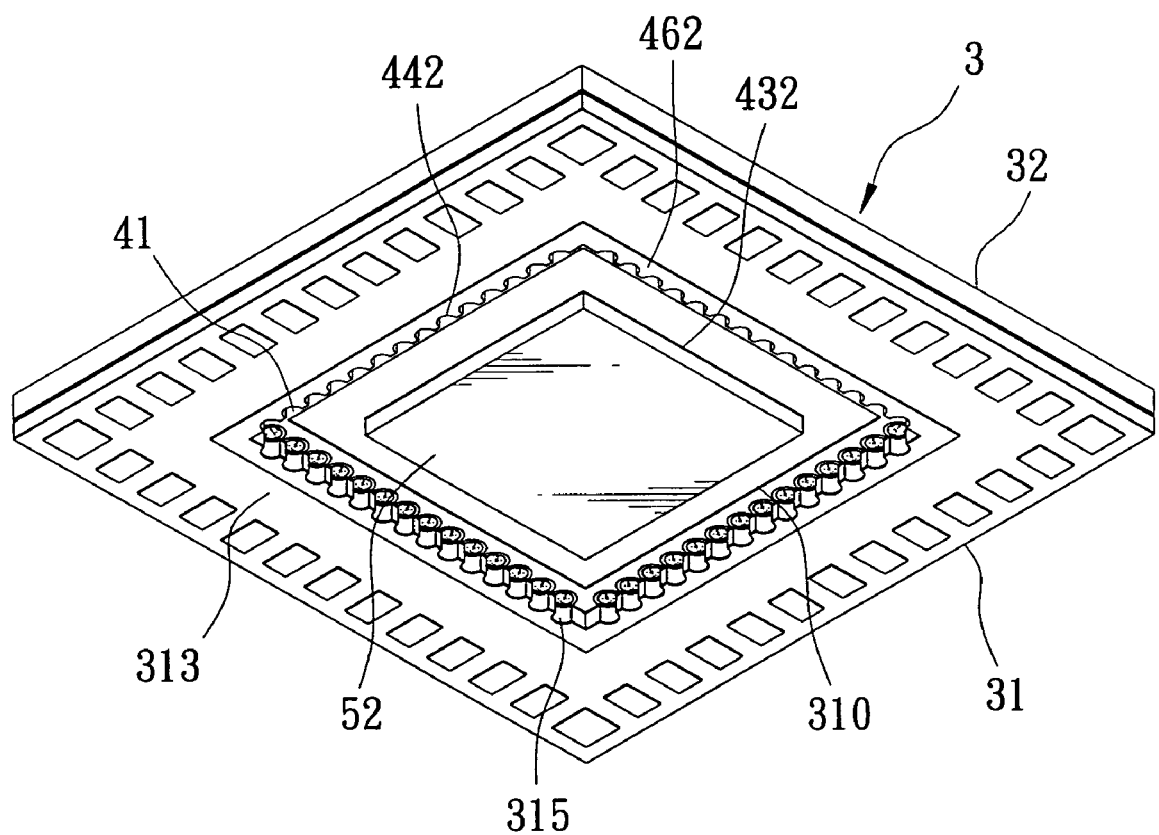
FIG. 7 is an assembled perspective view of the second preferred embodiment of the wireless communication module according to this invention.
Figure 8:
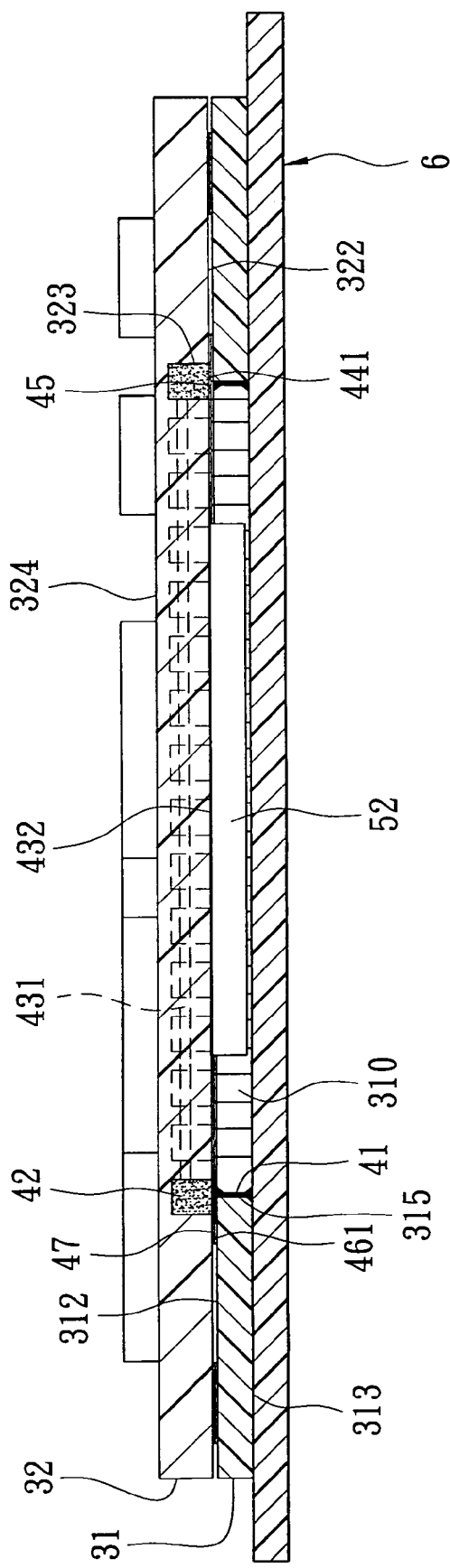
FIG. 8 is a sectional view of the second preferred embodiment.

FIGS. 7 and 8 illustrate the second preferred embodiment of the wireless communication module according to this invention. The second preferred embodiment differs from the previous embodiment in that, each of the retaining holes 314 is semi-circular in shape, extends through the inner and outer surfaces 312, 313 of the dielectric frame 31, and is defined by a hole-defining wall 315, and that each of the first conductive bodies 41 is coated on the hole-defining wall 315 of a respective one of the retaining holes 314. The semi-circular shape of each of the retaining holes 314 facilitates formation of the first conductive bodies 41.

With the inclusion of the first conductive bodies 41 and the second conductive bodies 42 in the wireless communication module of this invention, the aforesaid drawback associated with the prior art can be eliminated, and miniaturization of the wireless communication module can be achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A wireless communication module comprising:
   a mounting board including a dielectric frame and a dielectric panel that are stacked together, said dielectric frame defining a frame space, having opposite inner and outer surfaces, and being formed with a plurality of retaining holes surrounding said frame space, each of said retaining holes extending through said inner and outer surfaces, and having an inner end terminated at said inner surface of said dielectric frame, and an outer end terminated at said outer surface of said dielectric frame;
   at least one electronic component mounted on said mounting board and extending into said frame space;
   a plurality of first conductive bodies embedded in said dielectric frame and surrounding said frame space so as to prevent electromagnetic interference resulting from said electronic component, each of said first conductive bodies filling a respective one of said retaining holes;
   a plurality of first conductive pads each of which is formed on a periphery of said inner end of a respective one of said retaining holes; and
   a plurality of second conductive pads each of which is formed on a periphery of said outer end of a respective one of said retaining holes.

2. The wireless communication module as claimed in claim 1, wherein said dielectric frame has opposite inner and outer surfaces, and is formed with said plurality of retaining holes surrounding said frame space, each of said retaining holes extending through said inner and outer surfaces and being defined by a hole-defining wall, each of said first conductive bodies being coated on said hole-defining wall of a respective one of said retaining holes.

3. The wireless communication module as claimed in claim 1, further comprising a plurality of second conductive bodies embedded in said dielectric panel and corresponding and coupled electrically to said first conductive bodies.

4. The wireless communication module as claimed in claim 3, wherein said dielectric panel has opposite inner and outer surfaces, and is formed with a plurality of blind holes, each of which extends between said inner and outer surfaces of said dielectric panel and is terminated at said inner surface of said dielectric panel, each of said second conductive bodies filling a respective one of said blind holes.

5. The wireless communication module as claimed in claim 4, wherein each of said blind holes has an inner end terminated at said inner surface of said dielectric panel, said wireless communication module further comprising a plurality of third conductive pads, each of which is formed on a periphery of said inner end of a respective one of said blind holes.

6. The wireless communication module as claimed in claim 5, wherein said frame space of said dielectric frame has opposite inner and outer ends terminated respectively at said inner and outer surfaces of said dielectric frame, said wireless communication module further comprising first and second conductive layers formed respectively on peripheries of said inner and outer ends of said frame space and connected respectively to said first and second conductive pads, and a third conductive layer formed on said inner surface of said dielectric panel and connected to said first conductive layer and said third conductive pads.

7. The wireless communication module as claimed in claim 6, wherein said electronic component is mounted on said inner surface of said dielectric panel, said wireless communication module further comprising a conductive connecting via embedded in said dielectric panel and connected to said second conductive bodies, and a conductive connecting layer formed on said inner surface of said dielectric panel and connected to said electronic component and said conductive connecting via.

* * * * *